United States Patent
Thatte et al.

(10) Patent No.: US 11,881,773 B2
(45) Date of Patent: Jan. 23, 2024

(54) SYSTEMS AND METHODS FOR REDUCING POWER CONSUMPTION OF A POWER SUPPLY DURING A LOAD'S SLEEP MODE

(71) Applicant: SCHNEIDER ELECTRIC IT CORPORATION, Foxboro, MA (US)

(72) Inventors: Mihir Sunil Thatte, Thane (IN); Pavan Kumar Gudipalli, Bangalore (IN); Vishnu Sreekumar S, Bengaluru (IN); Sivanageswararao Uddanti, Bangalore (IN); Pradeep Tolakanahalli Nagabhushanrao, Bangalore (IN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 168 days.

(21) Appl. No.: 17/114,967

(22) Filed: Dec. 8, 2020

(65) Prior Publication Data

US 2021/0194366 A1    Jun. 24, 2021

Related U.S. Application Data

(60) Provisional application No. 62/950,312, filed on Dec. 19, 2019.

(51) Int. Cl.
    *H02J 9/06*     (2006.01)
    *H02M 3/158*   (2006.01)
    *H03K 19/00*   (2006.01)

(52) U.S. Cl.
    CPC ............ *H02M 3/158* (2013.01); *H02J 9/061* (2013.01); *H03K 19/0016* (2013.01)

(58) Field of Classification Search
CPC ... H03K 19/0016; H03K 19/0008; H02J 9/06; H02J 9/06104; H02J 9/005; H02M 3/158; H02M 3/1584; H02M 3/16; H02M 3/285; H02M 3/3155; H02M 3/33561; H02M 3/156

See application file for complete search history.

(56) References Cited

U.S. PATENT DOCUMENTS

| | | | |
|---|---|---|---|
| 8,533,508 B2* | 9/2013 | Chang | G06F 1/3265 323/221 |
| 2010/0202161 A1* | 8/2010 | Sims | H02M 7/02 363/20 |
| 2011/0068819 A1* | 3/2011 | Sims | G01R 31/40 324/691 |

* cited by examiner

*Primary Examiner* — Nguyen Tran
(74) *Attorney, Agent, or Firm* — Lando & Anastasi, LLP

(57) ABSTRACT

A power circuit including an input configured to receive input power from an input source, a first output configured to provide LPS output power to a load, a Logic Power Supply (LPS) configured to convert the input power into the LPS output power, the LPS configured to provide, in a first mode, the LPS output power with a first voltage level in response to receiving an indication that the load is being powered by the LPS output power and configured to provide, in a second mode, the LPS output power with a second voltage level in response to receiving an indication that the load is not being powered by the LPS output power, and a first switch configured to couple the LPS to the first output in the first mode and to decouple the LPS from the first output in the second mode.

17 Claims, 6 Drawing Sheets

SYSTEMS AND METHODS FOR REDUCING POWER CONSUMPTION OF A POWER SUPPLY DURING A LOAD'S SLEEP MODE

CROSS-REFERENCE TO RELATED APPLICATIONS

This application claims priority under 35 U.S.C. § 119(e) to U.S. Provisional Application Ser. No. 62/950,312 titled "SYSTEMS AND METHODS FOR REDUCING POWER CONSUMPTION DURING A POWER SUPPLY'S SLEEP MODE," filed on Dec. 19, 2019, which is hereby incorporated by reference in its entirety.

BACKGROUND

1. Field of Invention

The present disclosure relates generally to power supplies. More particularly, aspects of the present disclosure relate to systems and methods for reducing power consumption of a power supply during a sleep mode of the load.

2. Discussion of Related Art

The use of power devices, such as uninterruptible power supplies (UPS), to provide regulated, uninterrupted power for sensitive and/or critical loads, such as computer systems and other data processing systems, is known. Known uninterruptible power supplies include on-line UPS's, off-line UPS's, line interactive UPS's as well as others. On-line UPS's provide conditioned AC power as well as back-up AC power upon interruption of a primary source of AC power. Off-line UPS's typically do not provide conditioning of input AC power but do provide back-up AC power upon interruption of the primary AC power source. Line interactive UPS's are similar to off-line UPS's in that they switch to battery power when a blackout occurs but also typically include a multi-tap transformer for regulating the output voltage provided by the UPS. Logic Power Supply (LPS) systems typically provide required bias power to different subsystems (e.g., a Digital Signal Processor (DSP), microcontroller, control and communication systems, gate driver, etc.) of an Uninterruptible Power Supply (UPS).

SUMMARY

At least one aspect of the present disclosure is directed to a power circuit including an input configured to be coupled to an input source and to receive input power from the input source, a first output configured to provide LPS output power to a load, a Logic Power Supply (LPS) coupled to the input and configured to convert the input power into the LPS output power, the LPS configured to provide, in a first mode of operation, the LPS output power with a first voltage level in response to receiving an indication that the load is being powered by the LPS output power and configured to provide, in a second mode of operation, the LPS output power with a second voltage level in response to receiving an indication that the load is not being powered by the LPS output power, and a first switch configured to couple the LPS to the first output in the first mode of operation and to decouple the LPS from the first output in the second mode of operation.

In one embodiment, the power circuit includes a converter coupled to the LPS and configured to provide converter output power to a second output. In some embodiments, the converter is configured to receive the LPS output power from the LPS and convert the LPS output power into the converter output power. In certain embodiments, the converter is configured to receive intermediate power from the LPS and convert the intermediate power into the converter output power. In various embodiments, the second output is coupled to a controller configured to be powered by the converter output power and to provide at least one control signal indicating whether the load is being powered by the LPS output power.

In some embodiments, the load includes processing equipment coupled to the first output and configured to be powered by the LPS output power and to operate in at least an active state and a sleep state. In one embodiment, the second output is coupled to a controller configured to be powered by the converter output power and to provide at least one control signal indicating whether the load is being powered by the LPS output power, the controller being coupled to the processing equipment and configured to provide the at least one control signal such that the power circuit is operated in the first mode of operation while the processing equipment is operating in the active state and in the second mode of operation while the processing equipment is operating in the sleep state.

In certain embodiments, the second voltage level is a predetermined level selected to optimize efficiency of the power circuit while powering the controller during the second mode of operation. In one embodiment, the power circuit includes a feedback circuit configured to provide at least one feedback parameter to the LPS, the first and second voltage levels corresponding to the at least one feedback parameter of the LPS. In some embodiments, the feedback circuit includes a second switch configured to adjust the at least one feedback parameter to a first state in the first mode of operation and to a second state in the second mode of operation. In various embodiments, the first switch is included in the LPS.

Another aspect of the present disclosure is directed to a non-transitory computer-readable medium storing thereon sequences of computer-executable instructions for operating a power circuit. The sequences of computer-executable instructions include instructions that instruct at least one processor to operate the power circuit to receive input power from an input source at an input, operate a Logic Power Supply (LPS) to convert the input power into LPS output power provided to a first output, the LPS being configured to provide, in a first mode of operation, the LPS output power with a first voltage level in response to receiving an indication that a load coupled to the first output is being powered by the LPS output power and configured to provide, in a second mode of operation, the LPS output power with a second voltage level in response to receiving an indication that the load is not being powered by the LPS output power, control, in the first mode of operation, a first switch to couple the LPS to the first output, and control, in the second mode of operation, the first switch to decouple the LPS from the first output.

In one embodiment, the sequences of instructions include instructions that cause the at least one processor to operate the power circuit to operate a converter coupled to the LPS to provide converter output power. In some embodiments, operating the converter to provide the converter output power further includes operating the converter to convert the LPS output power provided by the LPS into the converter output power. In various embodiments, operating the converter to provide the converter output power further includes operating the converter to convert intermediate power provided by the LPS into the converter output power. In certain embodiments, the sequences of instructions include instructions that cause the at least one processor to operate the power circuit to receive at least one control signal indicating whether the load is being powered by the LPS output power, and provide the converter output power to a second output to power a controller coupled to the second output, the controller being configured to provide the at least one control signal.

In some embodiments, the sequences of instructions include instructions that cause the at least one processor to operate the power circuit to provide the LPS output power to the first output to power processing equipment coupled to the first output, the processing equipment being configured to operate in at least an active state and a sleep state. In one embodiment, the controller is coupled to the processing equipment and configured to provide the at least one control signal such that the power circuit is operated in the first mode of operation while the processing equipment is operating in the active state and in the second mode of operation while the processing equipment is operating in the sleep state. In various embodiments, the second voltage level is a predetermined level selected to optimize efficiency of the power circuit while powering the controller during the second mode of operation.

Another aspect of the present disclosure is directed to a method of assembling a power circuit. The method includes providing a Logic Power Supply (LPS) configured to be coupled to an input, the LPS being configured to provide, in a first mode of operation, output power with a first voltage level to an output in response to receiving an indication that a load coupled to the output is being powered by the output power and to provide, in a second mode of operation, output power with a second voltage level in response to receiving an indication that the load is not being powered by the output power, and coupling a switch between the LPS and the output, the switch being configured to couple the LPS to the output in the first mode of operation and to decouple the LPS from the output in the second mode of operation.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
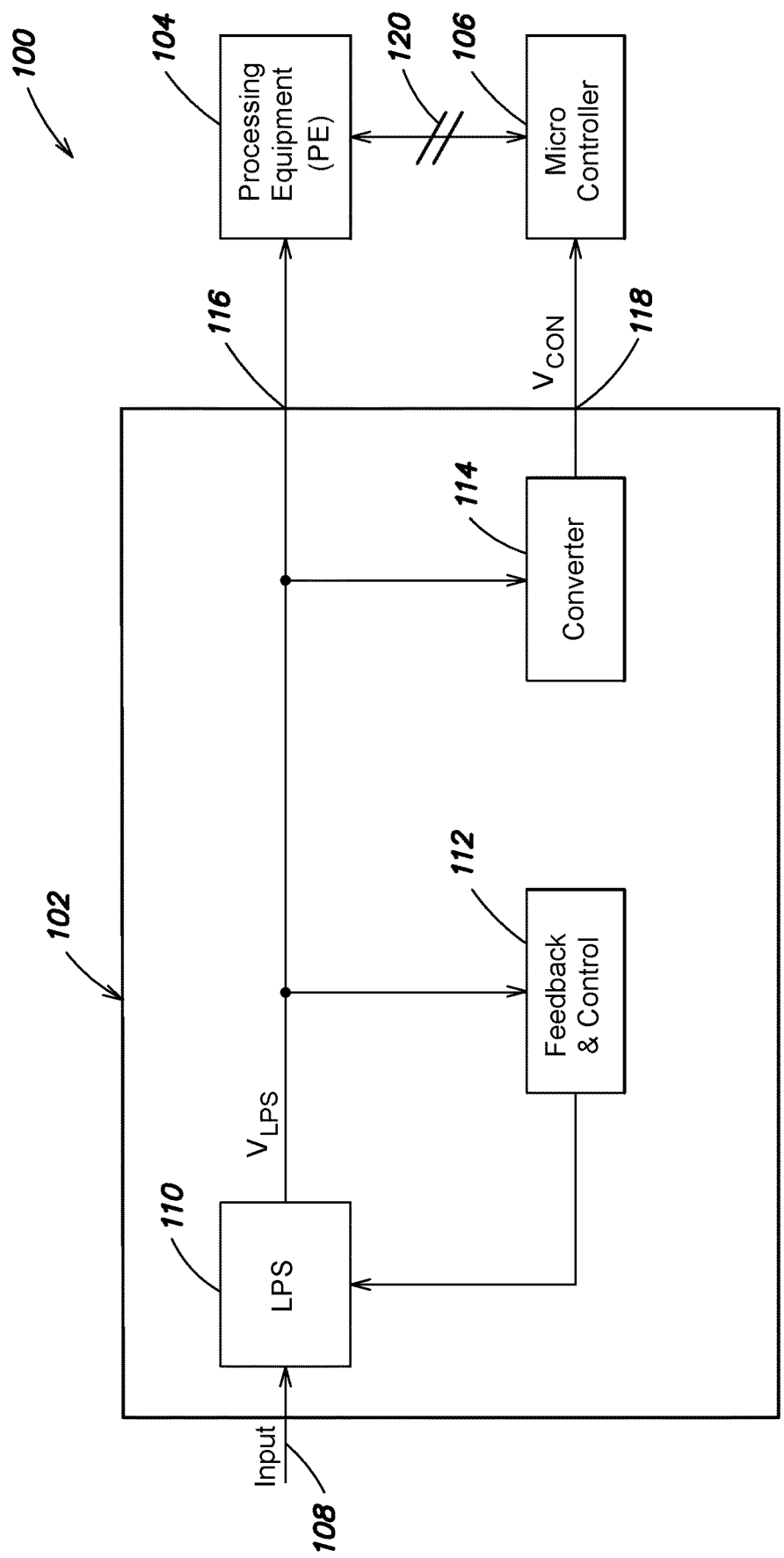
FIG. 1 is a functional block diagram of a power supply system in accordance with aspects described herein.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, power supplies, such as uninterruptible power supplies (UPS), are oftentimes used to provide regulated, uninterrupted power to sensitive and/or critical loads. In some cases, a UPS may include a Logic Power Supply (LPS) system configured to provide bias power to processing equipment (e.g., a Digital Signal Processor (DSP), microcontroller, control and communication systems, gate driver, etc.) of the UPS. In certain examples, the LPS system may be configured to power a battery charger system, a temperature monitoring system, periodic data collector, etc. of the UPS.

In some examples, the LPS system is designed to operate at maximum efficiency (or maximum output) while fully supporting the processing equipment of the UPS. However, the processing equipment may be configured to operate in multiple modes or states of operation. For example, the processing equipment may operate in an active state (i.e., normal operation) and a sleep state (i.e., low power operation). As such, when the processing equipment is operating in the sleep state with low power consumption, the LPS system may operate inefficiently due to the reduced power consumption levels of the processing equipment.

In addition, electronic equipment (e.g., power supply systems, LPSs, etc.) may be subject to efficiency standards imposed by regulatory bodies, such as national and/or state energy commissions, environmental protection agencies, etc. As such, manufacturers of power supply systems (or LPSs) must provide products which comply with these standards and regulations. In some cases, when power supply systems or LPSs operate inefficiently due to reduced load power consumption of corresponding processing equipment, it can be difficult to meet such standards and regulations.

As such, an improved power supply system and method of operation are provided herein. In at least one embodiment, the power supply system includes an LPS configured to provide output power having a first voltage level when the load is being powered by the LPS and output power having a second voltage level when the load is not being powered by the LPS. In some examples, the LPS is selectively decoupled from the load when the load is not being powered by the LPS. In certain examples, by adjusting the voltage level of the output power provided by the LPS and selectively decoupling the LPS from the load, the LPS and the power supply system can operate with improved efficiency.

FIG. 1 is a block diagram of a power supply system 100. In one example, the power supply system 100 includes an LPS assembly 102, processing equipment 104, and a controller 106. As shown, the LPS assembly 102 includes an input 108, an LPS 110, a feedback and control unit 112, a converter 114, a first output 116, and a second output 118. As shown, the first output 116 is coupled to the processing equipment 104 and the second output 118 is coupled to the controller 106. In addition, the processing equipment 104 is coupled via a control line 120 to the controller 106.

In some examples, the controller 106 is configured to control or operate the processing equipment 104. In certain examples, the controller 106 includes one or more general computing processors, specialized processors, or microcontrollers. The controller 106 may include specially-programmed, special-purpose hardware, for example, an application-specific integrated circuit (ASIC), or more generally designed hardware, such as a field programmable gate array (FPGA), or a general purpose processor. In some examples, the controller 106 is connected to one or more memory devices, such as a disk drive, memory, flash memory, embedded or on-chip memory, or other device for storing data. In certain examples, the controller 106 may be one or more controllers including one or more components such as one or more processors.

In one example, the input 108 is configured to receive input power (AC or DC) and provide the input power to the LPS 110. The LPS 110 converts the input power into LPS output power having a DC voltage level ($V_{LPS}$) and provides the LPS output power to the processing equipment 104 via the first output 116. In some examples, the LPS output power is also provided to the converter 114. The converter 114 converts the LPS output power having the DC voltage level ($V_{LPS}$) into converter output power having a DC voltage level ($V_{CON}$). The converter output power is provided to the controller 106 via the second output 118.

In some examples, the DC voltage level ($V_{CON}$) of the converter output power provided by the converter 114 is different (e.g., less) than the DC voltage level ($V_{LPS}$) of the LPS output power provided by the LPS 110. For example, the DC voltage level ($V_{CON}$) of the converter output power may be a voltage level that is optimized or desired for powering the controller 106 (e.g., 3.3V, 5V, etc.).

In certain examples, the LPS output power is also provided to the feedback and control unit 112. The feedback and control unit 112 includes feedback circuitry configured to provide one or more feedback parameters to the LPS 110. The one or more feedback parameters may be processed or referenced by the LPS 110 to set the DC voltage level ($V_{LPS}$) of the LPS output power. As such, the feedback and control unit 112 may adjust the one or more feedback parameters provided to the LPS 110 to adjust or maintain the DC voltage level ($V_{LPS}$). In some examples, an adjustment to the DC voltage level ($V_{LPS}$) of the LPS output power may also provide an adjustment to the DC voltage level ($V_{CON}$) of the converter output power.

As described above, the LPS assembly 102 provides the LPS output power to the processing equipment 104 via the first output 116. In some examples, the processing equipment 104 is configured to operate in at least two modes or states of operation, including an active state and a sleep state. In one example, the processing equipment 104 operates with complete functionality in the active state and operates with reduced functionality in the sleep state. For example, in the sleep state, the processing equipment may operate in a low power consumption mode, periodically "wake-up" to execute one or more functions, and return to the low power consumption mode. As such, when the processing equipment 104 is operating in the sleep state, the load on the LPS 110 is reduced.

In one example, when the load of the processing equipment 104 on the LPS 110 is reduced, the LPS 110 can become inefficient and lossy due to the reduced power consumption levels. In some examples, when the processing equipment 104 is configured to operate in the sleep state for an extended period of time, the reduced efficiency of the LPS 110 can increase the overall energy consumption of the power supply system 100. In certain examples, the input 108 is configured to receive input DC power from a battery. In such examples, inefficient operation of the LPS 110 can lead to a shorter run time and/or deep battery discharge (i.e., over-discharge).

Figure 2:
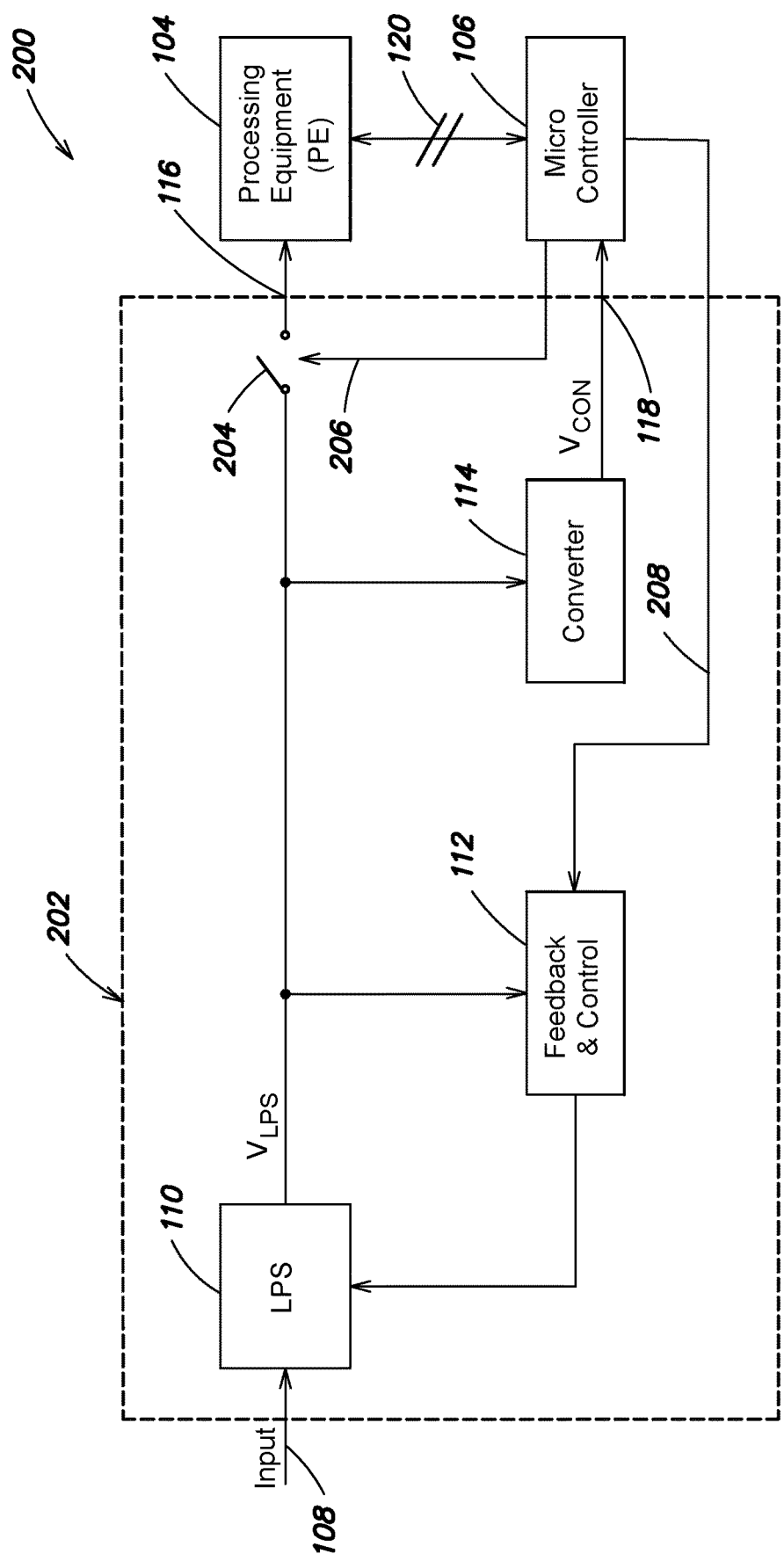
FIG. 2 is a functional block diagram of a power supply system in accordance with aspects described herein.

FIG. 2 is a block diagram of another power supply system 200. In one example, the power supply system 200 includes an LPS assembly 202 that is similar to the LPS assembly 102 of FIG. 1, except the LPS assembly 202 includes a switch 204. In some examples, the switch 204 is configured to selectively decouple the LPS 110 from the processing equipment 104 (or the first output 116).

As described above, the LPS 110 is operated to provide LPS output power to the processing equipment 104 via the first output 116. Likewise, the converter 114 is operated to convert the LPS output power into converter output power and provide the converter output power to the controller 106 via the second output 118.

In some examples, the processing equipment 104 is configured to operate in at least an active state and a sleep state. In certain examples, the controller 106 may control or operate the processing equipment 104 in each of the active and sleep states (via the control line 120). In other examples, the processing equipment 104 may send an indication of its operating state to the controller 106. As such, the operating state of the processing equipment 104 is known by the controller 106.

In one example, the LPS assembly 202 is configured to receive one or more control signals from the controller 106 based on the operating state of the processing equipment 104. For example, the controller 106 may provide a first control signal 206 to operate (or control) the first switch 204 and a second control signal 208 to operate (or control) the feedback and control unit 112. In one example, the first and second control signals 206, 208 are two different control signals; however, in other examples, the first and second control signals 206, 208 may be the same control signal (or control voltage). In certain examples, the first control signal 206 and/or the second control signal 208 can be provided to control circuitry configured to operate (or control) the switch 204 and/or the feedback and control unit 112.

In some examples, the controller 106 is configured to control the LPS assembly 202 to operate in a first mode of operation and second mode of operation (via the one or more control signals). For example, when the processing equipment 104 is operating in the active state, the controller 106 may control the LPS assembly 202 to operate in the first mode of operation. Likewise, when the processing equipment 104 is operating in the sleep state, the controller 106 may control the LPS assembly 202 to operate in the second mode of operation.

In the first mode of operation, when the processing equipment 104 is operating in the active state, the switch 204 is controlled (or operated) by the first control signal 206 to couple the LPS 110 to the processing equipment 104 via the first output 116. In addition, the feedback and control unit 112 is controlled (or adjusted) by the control signal 208 to provide a first feedback parameter to the LPS 110. Based on the first feedback parameter, the LPS 110 is controlled (or operated) to provide the LPS output power having a first DC voltage level ($V_{LPS\_1}$). In one example, the first DC voltage level ($V_{LPS\_1}$) is selected or designed to provide optimal efficiency while the processing equipment 104 is operating in the active state. For example, the first DC voltage level ($V_{LPS\_1}$) may be selected such that the LPS assembly 202 (or the LPS 110) operates with maximum efficiency while supporting a load that includes the processing equipment 104 (in the active state) and the controller 106.

In the second mode of operation, when the processing equipment 104 is operating in the sleep state, the switch 204 is controlled (or operated) by the first control signal 206 to decouple the LPS 110 from the first output 116. In addition, the feedback and control unit 112 is controlled (or adjusted) by the control signal 208 to provide a second feedback parameter to the LPS 110. Based on the second feedback parameter, the LPS 110 is controlled (or operated) to provide the LPS output power having a second DC voltage level ($V_{LPS\_2}$). In one example, the second DC voltage level ($V_{LPS\_2}$) is a predetermined level that is selected or designed to provide optimal efficiency while powering only the controller 106. For example, the second DC voltage level ($V_{LPS\_2}$) may be selected such that the LPS assembly 202 (or the LPS 110) operates with improved efficiency while supporting only the controller 106.

In some examples, the LPS assembly 202 operates with improved efficiency in the second mode of operation by reducing stress on the converter 114. For example, the DC voltage level ($V_{CON}$) of the converter output power provided by the converter 114 is less than the first DC voltage level ($V_{LPS\_1}$) of the LPS output power provided by the LPS 110. As such, in the second mode of operation of the LPS assembly 202, when the LPS 110 is providing the LPS output power with the lower second DC voltage level ($V_{LPS\_2}$), stress on the converter 114 can be reduced. In certain examples, reducing stress on the converter 114 allows the converter 114 (and the LPS assembly 202) to operate with improved efficiency. In addition, by decoupling the LPS 110 from the first output 116, power losses associated with storage capacitors in the processing equipment 104 can be eliminated during the second mode of operation.

As described above, the feedback and control unit 112 is controlled (or adjusted) by the control signal 208 to provide the first or second feedback parameter to the LPS 110 depending on the mode of operation of the LPS assembly 202. In some examples, the feedback parameters correspond to an analog reference provided to the LPS 110, such as a reference voltage or current. In other examples, the feedback parameters may correspond to digital signals or commands provided to the LPS 110. In certain examples, additional components can be used in combination with the feedback and control unit 112 to provide different feedback parameters.

Figure 3:
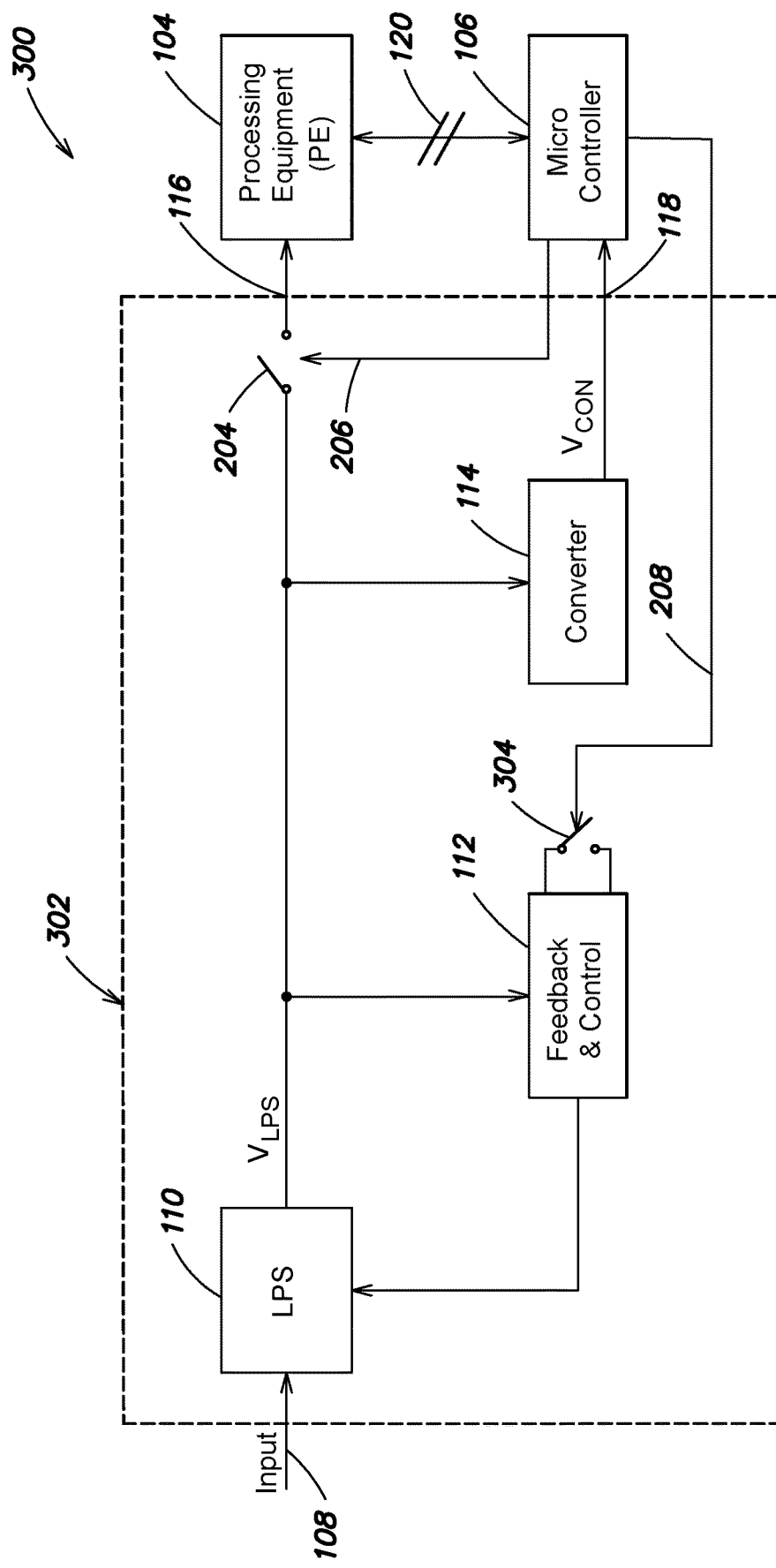
FIG. 3 is a functional block diagram of a power supply system in accordance with aspects described herein.

For example, FIG. 3 is a block diagram of another power supply system 300. In one example, the power supply system 300 includes an LPS assembly 302 that is similar to the LPS assembly 202 of FIG. 2, except the LPS assembly 302 includes an additional switch 304. In some examples, the switch 304 is operated to adjust the feedback parameters provided by the feedback and control unit 112.

As shown, the switch 304 may be controlled (or operated) by the control signal 208 provided by the controller 106. For example, in the first mode of operation of the LPS assembly 302, the control signal 208 may control the switch 304 to turn on (i.e., close), such that the feedback and control unit 112 provides the first feedback parameter to the LPS 110. In one example, the first feedback parameter corresponds to at least one control loop gain parameter (e.g., feedback fraction, voltage reference, etc.) of the feedback and control unit 112. Based on the at least one first feedback parameter, the LPS 110 operates to provide the LPS output power with the first DC voltage level ($V_{LPS\_1}$).

Similarly, in the second mode of operation of the LPS assembly 302, the control signal 208 may control the switch 304 to turn off (i.e., open) such that the feedback and control unit 112 provides the second feedback parameter to the LPS 110. In some examples, turning off the switch 304 causes one or more of the control loop gain parameters of the feedback and control unit 112 to change (or adjust). As such, the second feedback parameter may correspond to at least one of the adjusted control loop gain parameters. Based on the at least one second feedback parameter, the LPS 110 operates to provide the LPS output power with the second DC voltage level ($V_{LPS\_2}$).

It should be appreciated that the LPS assembly 302 may be configured to operate differently. For example, in the first mode of operation of the LPS assembly 302, the control signal 208 may control the switch 304 to turn off (i.e., open). Likewise, in the second mode of operation of the LPS assembly 302, the control signal 208 may control the switch 304 to turn on (i.e., close).

Figure 4:
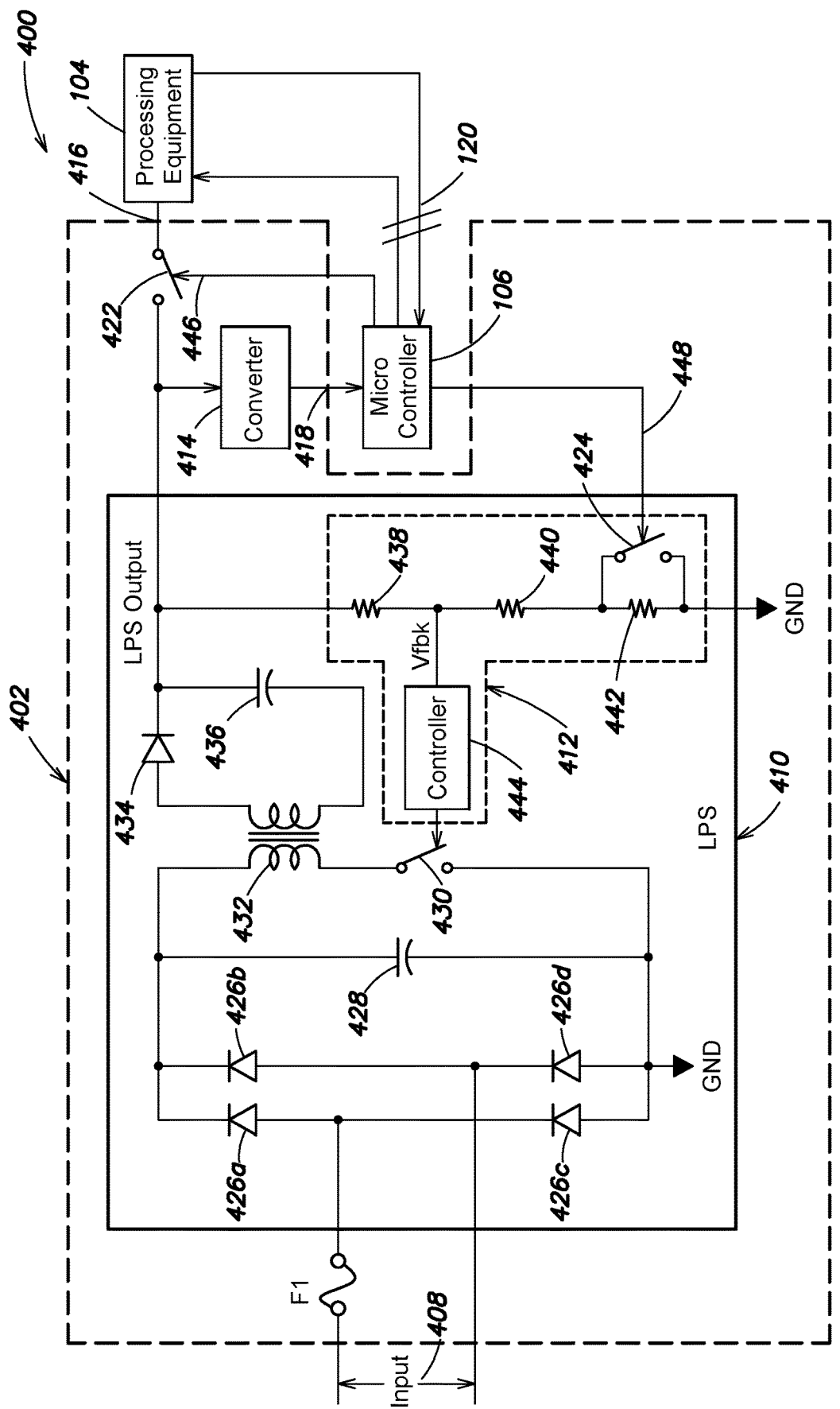
FIG. 4 is a schematic diagram of a power supply system in accordance with aspects described herein.

FIG. 4 is a schematic diagram of a power supply system 400. In one example, the power supply system 400 corresponds to the power supply system 300 of FIG. 3. In some examples, the power supply system 400 includes an LPS assembly 402, the processing equipment 104, and the controller 106. The LPS assembly 402 includes an input 408, an LPS 410, a feedback and control unit 412, a converter 414, a first output 416, a second output 418, and a switch 422. As shown, the first output 416 is coupled to the processing equipment 104 and the second output 418 is coupled to the controller 106. In addition, the processing equipment 104 is coupled via the control line 120 to the controller 106.

In one example, the LPS 410 is configured as an offline-Flyback converter. As shown, the LPS 410 includes a rectifier (diodes 426a-426d), a first capacitor 428, a switch 430, a transformer 432, a first diode 434, and a second capacitor 436. In some examples, the feedback and control unit 412 is included in the LPS 410. In one example, the feedback and control unit 412 includes a switch 424, a first resistor 438, a second resistor 440, a third resistor 442, and a controller 444. In certain examples, the resistors 438-442 form a feedback network (e.g., voltage divider) configured to provide a feedback voltage ($V_{fbk}$) to the controller 444. Based on the feedback voltage ($V_{fbk}$), the controller 444 controls (or operates) the switch 430 such that the LPS 410 provides output power with desired voltage levels.

Similar to the LPS 110 of the LPS assembly 302, the LPS 410 is operated to provide LPS output power to the processing equipment 104 via the first output 416. Likewise, the converter 414 is operated to convert the LPS output power into converter output power and provide the converter output power to the controller 106 via the second output 418.

In one example, the LPS assembly 402 is configured to receive one or more control signals from the controller 106 based on the operating state of the processing equipment 104. For example, the controller 106 may provide a first control signal 446 to operate (or control) the switch 422 and a second control signal 448 to operate (or control) the switch 424. In one example, the first and second control signals 446, 448 are two different control signals; however, in other examples, the first and second control signals 446, 448 may be the same control signal (or control voltage). In certain examples, the first control signal 446 and/or the second control signal 448 can be provided to control circuitry configured to operate (or control) the switch 422 and/or the switch 424.

In some examples, the controller 106 is configured to control the LPS assembly 402 to operate in a first mode of operation and second mode of operation (via the one or more control signals). For example, when the processing equipment 104 is operating in the active state, the controller 106 may control the LPS assembly 402 to operate in the first mode of operation. Likewise, when the processing equipment 104 is operating in the sleep state, the controller 106 may control the LPS assembly 402 to operate in the second mode of operation.

In the first mode of operation, when the processing equipment 104 is operating in the active state, the switch 422 is controlled (or operated) by the first control signal 446 to couple the LPS 410 to the processing equipment 104 via the first output 416. In addition, the switch 424 is turned on (i.e., closed) by the control signal 448. As such, the third resistor 442 of the feedback network included in the feedback and control unit 412 is bypassed, and the feedback voltage ($V_{tbk}$) is set to a first state/level. Based on the feedback voltage ($V_{tbk}$), the switch 430 of the LPS 410 is controlled (or operated) by the controller 444 such that the LPS 410 provides the LPS output power having the first DC voltage level ($V_{LPS\_1}$). As described above, the first DC voltage level ($V_{LPS\_1}$) is selected or designed to provide optimal efficiency while the processing equipment 104 is operating in the active state.

In the second mode of operation, when the processing equipment 104 is operating in the sleep state, the switch 422 is controlled (or operated) by the first control signal 446 to decouple the LPS 410 from the first output 416. In addition, the switch 424 is turned off (i.e., opened) by the control signal 448. As such, the third resistor 442 of the feedback network is no longer bypassed, allowing the feedback voltage ($V_{tbk}$) to be set to a second state/level. Based on the feedback voltage ($V_{tbk}$), the switch 430 of the LPS 410 is controlled (or operated) by the controller 444 such that the LPS 410 provides the LPS output power having the second DC voltage level ($V_{LPS\_2}$). As described above, the second DC voltage level ($V_{LPS\_2}$) is selected or designed to provide optimal efficiency while powering only the controller 106.

It should be appreciated that the LPS assembly 402 may be configured to operate differently. For example, in the first mode of operation of the LPS assembly 402, the control signal 448 may control the switch 424 to turn off (i.e., open). Likewise, in the second mode of operation of the LPS assembly 402, the control signal 448 may control the switch 424 to turn on (i.e., close).

Figure 5:
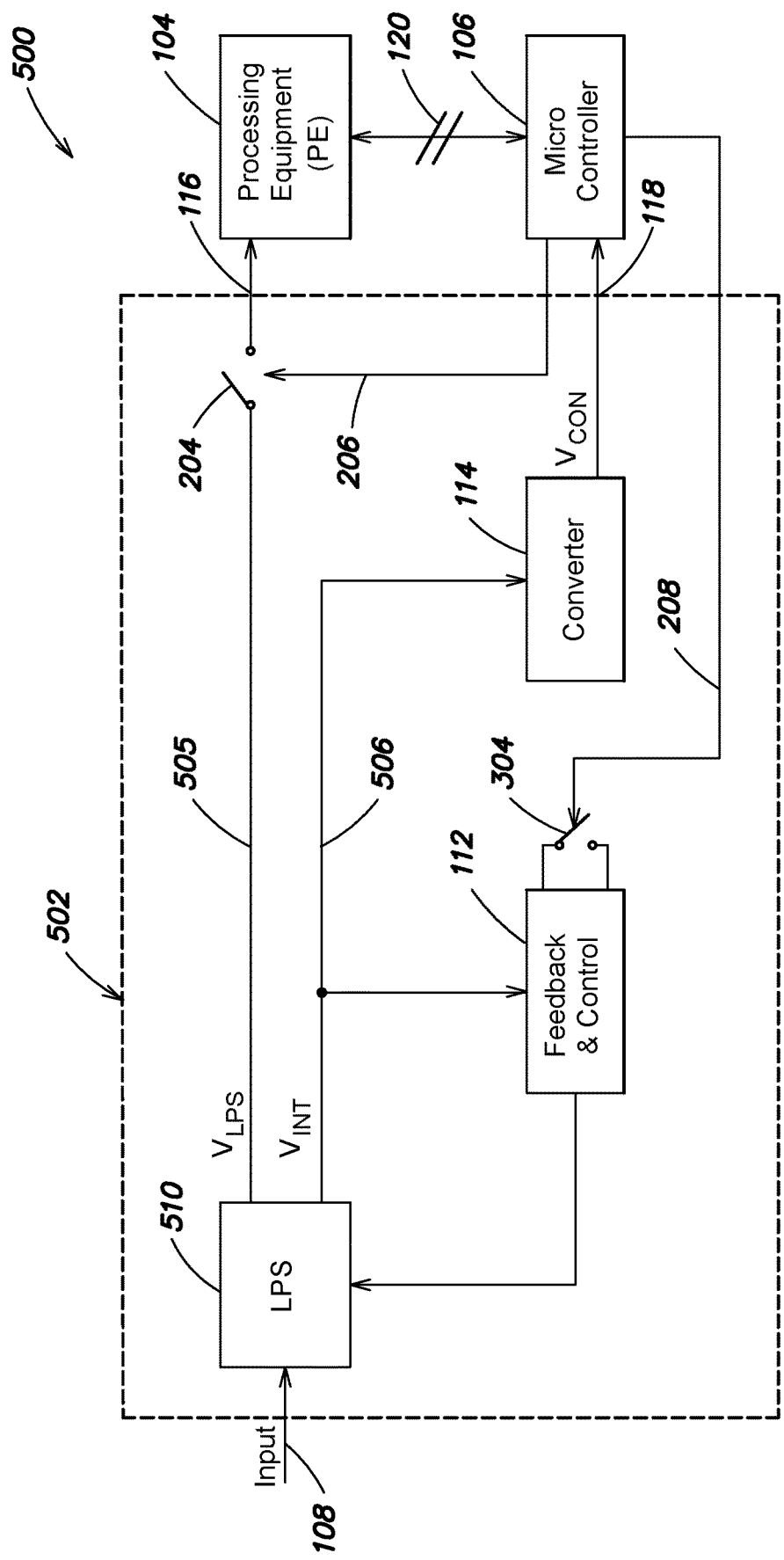
FIG. 5 is a functional block diagram of a power supply system in accordance with aspects described herein.

In some examples, the LPS may have a different configuration. For example, FIG. 5 is a block diagram of another power supply system 500. In some examples, the power supply system 500 includes an LPS assembly 502 that is similar to the LPS assembly 302 of FIG. 3, except the LPS assembly 502 includes an LPS 510 having multiple outputs.

In one example, the LPS 510 includes a first LPS output 504 and a second LPS output 506. In some examples, the first LPS output 504 provides LPS output power to the processing equipment 104 via the first output 116. The converter 114 is operated to convert intermediate power provided by the second LPS output 506 into converter output power having a DC voltage level ($V_{CON}$). The converter output power is provided to the controller 106 via the second output 118.

As described above, the LPS assembly 502 is configured to receive one or more control signals from the controller 106 based on the operating state of the processing equipment 104. For example, the controller 106 may provide the first control signal 206 to operate (or control) the switch 204 and the second control signal 208 to operate (or control) the switch 304. In one example, the first and second control signals 206, 208 are two different control signals; however, in other examples, the first and second control signals 206, 208 may be the same control signal (or control voltage). In certain examples, the first control signal 206 and/or the second control signal 208 can be provided to control circuitry configured to operate (or control) the switch 204 and/or the switch 304.

In some examples, the controller 106 is configured to control the LPS assembly 502 to operate in a first mode of operation and second mode of operation (via the one or more control signals). For example, when the processing equipment 104 is operating in the active state, the controller 106 may control the LPS assembly 502 to operate in the first mode of operation. Likewise, when the processing equipment 104 is operating in the sleep state, the controller 106 may control the LPS assembly 502 to operate in the second mode of operation.

In the first mode of operation, when the processing equipment 104 is operating in the active state, the switch 204 is controlled (or operated) by the first control signal 206 to couple the first LPS output 504 to the processing equipment 104 via the first output 116. In addition, the control signal 208 may control the switch 304 to turn on (i.e., close), such that the feedback and control unit 112 provides a first feedback parameter to the LPS 510. Based on the first feedback parameter, the LPS 510 operates to provide the LPS output power with an output voltage level ($V_{LPS}$) via the first LPS output 504. In addition, the LPS 510 operates to provide the intermediate power with a first intermediate voltage level ($V_{INT\_1}$) via the second LPS output 506.

In one example, the output voltage level ($V_{LPS}$) of the LPS output power and the first intermediate voltage level ($V_{INT\_1}$) of the intermediate power are selected or designed to provide optimal efficiency while the processing equipment 104 is operating in the active state. For example, the output voltage level ($V_{LPS}$) and the first intermediate voltage level ($V_{INT\_1}$) may be selected such that the LPS assembly 502 (or the LPS 510) operates with maximum efficiency while supporting a load that includes the processing equipment 104 (in the active state) and the controller 106.

In the second mode of operation, when the processing equipment 104 is operating in the sleep state, the switch 204 is controlled (or operated) by the first control signal 206 to decouple the first LPS output 504 of the LPS 510 from the first output 116. In addition, the control signal 208 may control the switch 304 to turn off (i.e., open) such that the feedback and control unit 112 provides a second feedback parameter to the LPS 510. Based on the second feedback parameter, the LPS 510 operates to provide the intermediate power with a second intermediate voltage level ($V_{INT\_2}$) via the second LPS output 506. In some examples, the second intermediate voltage level ($V_{INT\_2}$) is less than the first intermediate voltage level ($V_{INT\_1}$).

In one example, the second intermediate voltage level ($V_{INT\_2}$) is selected or designed to provide optimal efficiency while powering the controller 106. For example, the second intermediate voltage level ($V_{INT\_2}$) may be selected such that the LPS assembly 502 (or the LPS 510) operates with improved efficiency while supporting only the controller 106.

As described above, LPS systems may be included in a UPS and configured to provide bias power to processing equipment (e.g., a Digital Signal Processor (DSP), microcontroller, control and communication systems, gate driver, etc.) of the UPS.

Figure 6:
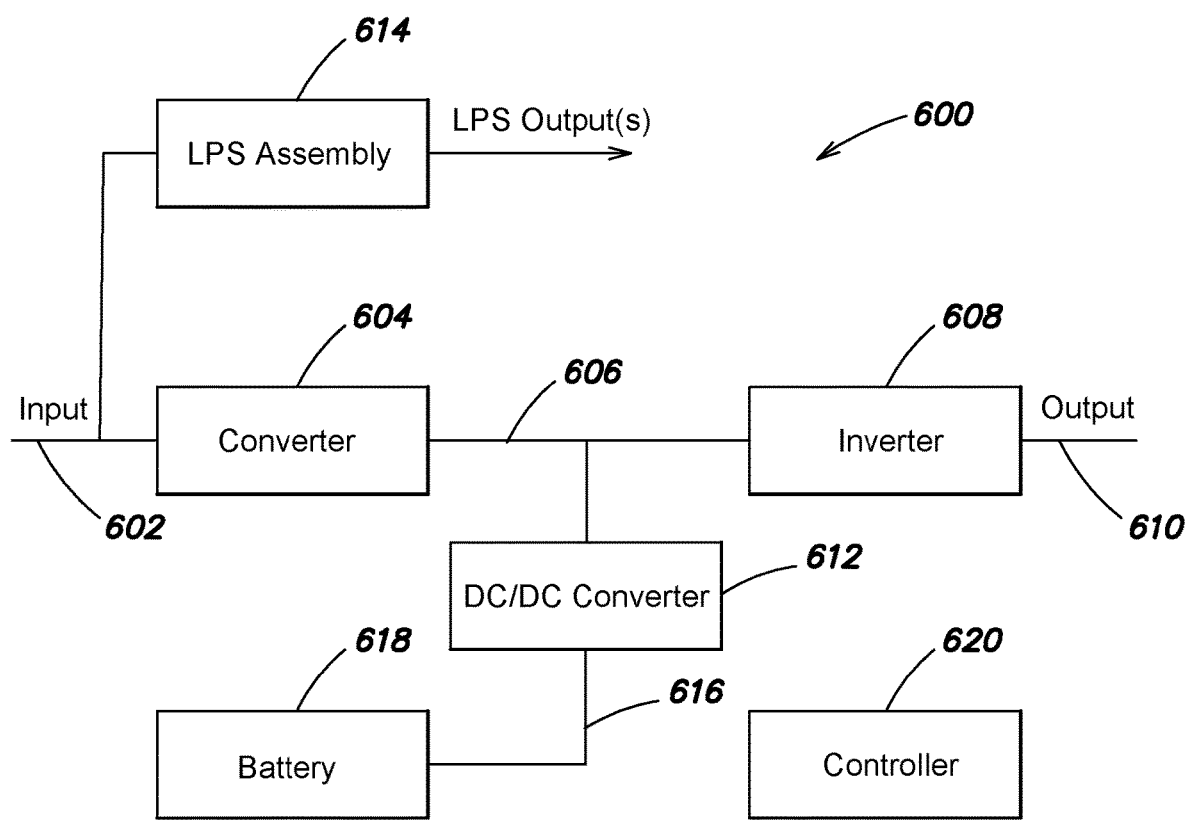
FIG. 6 is a functional block diagram of a UPS in accordance with aspects described herein.

FIG. 6 is a block diagram of a UPS 600 in accordance with aspects described herein. In one example, the UPS 600 is configured as an online UPS. As shown, the UPS 600 includes an input 602, a converter 604, a DC bus 606, an inverter 608, an output 610, a DC/DC converter 612, an LPS assembly 614, and a backup power interface 616. In some examples, the backup power interface 616 is configured to receive backup DC power from a battery 618. In certain examples, the UPS 600 may include the battery 618; however, in other examples the battery 618 may be external to the UPS 600.

In addition, a controller 620 may be included in the UPS 600. In one example, the controller 620 is coupled to and configured to operate the converter 604 and the inverter 608. In certain examples, the controller 620 is external to the UPS 600. In some examples, the controller 620 includes one or more general computing processors, specialized processors, or microcontrollers. The controller 620 may include specially-programmed, special-purpose hardware, for example, an application-specific integrated circuit (ASIC), or more generally designed hardware, such as a field programmable gate array (FPGA), or a general purpose processor. In some examples, the controller 620 is connected to one or more memory devices, such as a disk drive, memory, flash memory, embedded or on-chip memory, or other device for storing data. In certain examples, the controller 620 may be one or more controllers including one or more components such as one or more processors.

In one example, the UPS 600 is configured to receive input AC power provided by an electric utility at the input 602. The converter 604 rectifies the input AC power to provide DC power to the DC bus 606. In some examples, the converter 604 is configured as a Power Factor Correction converter circuit (PFC). The rectified DC power on the DC bus 606 may be provided to the DC/DC converter 612 to charge the battery 618 while mains (i.e., utility) power is available. In the absence of mains power, the DC/DC converter 612 is operated to discharge the battery 618 and provide DC power to the DC bus 606. From the DC power on the DC bus 606, the inverter 608 generates AC output power that is provided to a load coupled to the output 610 (not shown). Since power is provided to the DC bus 606 from either mains or the battery 618, the output power of the UPS 600 is uninterrupted if the mains fails and the battery 618 is sufficiently charged. While not shown, the UPS 600 may also operate in a bypass mode where unconditioned power with basic protection is provided directly from an AC power source to the load via a bypass line.

In one example, the LPS assembly 614 corresponds to one of the LPS assemblies described herein (e.g., 202, 302, 402, or 502). As shown, the LPS assembly 614 may be coupled to the input 602 of the UPS 600 and configured to provide output power to one or more loads (e.g., the processing equipment 104 and the controller 106). As described above, the LPS assembly 614 may be operated in a first or second mode of operation depending on the state of the processing equipment 104. In other examples, the LPS assembly 614 can be configured differently. For example, the input of the LPS assembly 614 may be coupled to the DC bus 606.

While the LPS assembly 614 is shown as being included in an online UPS (e.g., UPS 600), it should be appreciated that the LPS assembly 614 may be included in different types of UPS configurations. For example, the LPS assembly 614 may be included in an offline UPS, DC-UPS, delta-conversion UPS, etc.

As described above, an improved power supply system and method of operation are provided herein. In at least one embodiment, the power supply system includes an LPS configured to provide output power having a first voltage level when the load is being powered by the LPS and output power having a second voltage level when the load is not being powered by the LPS. In some examples, the LPS is selectively decoupled from the load when the load is not being powered by the LPS. In certain examples, by adjusting the voltage level of the output power provided by the LPS and selectively decoupling the LPS from the load, the LPS and the power supply system can operate with improved efficiency.

Having thus described several aspects of at least one embodiment of this invention, it is to be appreciated various alterations, modifications, and improvements will readily occur to those skilled in the art. Such alterations, modifications, and improvements are intended to be part of this disclosure and are intended to be within the spirit and scope of the invention. Accordingly, the foregoing description and drawings are by way of example only.

What is claimed is:

1. A power circuit comprising:
an input configured to be coupled to an input source and to receive input power from the input source;
a first output configured to provide output power to a load;
a second output configured to provide output power to a controller;
a Logic Power Supply (LPS) coupled to the input and configured to convert the input power into LPS output power;
a first switch configured to couple the LPS to the first output in a first mode of operation and to decouple the LPS from the first output in a second mode of operation, the LPS further configured to provide, in the first mode of operation, the LPS output power with a first voltage level to the first switch in response to receiving an indication that the load is being powered by the LPS output power and configured to provide, in the second mode of operation, the LPS output power to the first switch with a second voltage level in response to receiving an indication that the load is not being powered by the LPS output power, the second voltage level being generated by the LPS based on a level sufficient to power the controller; and
a converter coupled to the LPS and the second output, the converter configured, in the second mode of operation, to convert the LPS output power with the second voltage level into converter output power and provide the converter output power to the controller via the second output to power the controller, wherein the second output is disconnected from the first output such that the second output does not provide power to the first switch.

2. The power circuit of claim 1 further comprising the controller which is configured to provide at least one control signal indicating whether the load is being powered by the LPS output power.

3. The power circuit of claim 1, wherein the load includes processing equipment coupled to the first output and configured to be powered by the LPS output power and to operate in at least an active state and a sleep state.

4. The power circuit of claim 3, wherein the second output is coupled to the controller which is configured to be powered by the converter output power and to provide at least one control signal indicating whether the load is being powered by the LPS output power, the controller being coupled to the processing equipment and configured to provide the at least one control signal such that the power circuit is operated in the first mode of operation while the processing equipment is operating in the active state and in the second mode of operation while the processing equipment is operating in the sleep state.

5. The power circuit of claim 4, wherein the second voltage level is a predetermined level selected to optimize efficiency of the power circuit while powering the controller during the second mode of operation.

6. The power circuit of claim 1, further comprising a feedback circuit configured to provide at least one feedback parameter to the LPS, the first and second voltage levels corresponding to the at least one feedback parameter of the LPS.

7. The power circuit of claim 6, wherein the feedback circuit includes a second switch configured to adjust the at least one feedback parameter to a first state in the first mode of operation and to a second state in the second mode of operation.

8. The power circuit of claim 1, wherein the first switch is included in the LPS.

9. A non-transitory computer-readable medium storing thereon sequences of computer-executable instructions for operating a power circuit, the sequences of computer-executable instructions including instructions that instruct at least one processor to operate the power circuit to:
receive input power from an input source at an input;
operate a Logic Power Supply (LPS) to convert the input power into LPS output power provided to a first switch, the LPS being configured to provide, in a first mode of operation, the LPS output power with a first voltage level to the first switch in response to receiving an indication that a load coupled to the first switch is being powered by the LPS output power and configured to provide, in a second mode of operation, the LPS output power with a second voltage level to the first switch in response to receiving an indication that the load is not being powered by the LPS output power, the second voltage level being generated by the LPS based on a level sufficient to power a controller coupled to the power circuit;
control, in the first mode of operation, the first switch to couple the LPS to a first output configured to be coupled to the load;
control, in the second mode of operation, the first switch to decouple the LPS from the first output;
convert, in the second mode of operation with a converter coupled to the LPS and a second output, the LPS output power with the second voltage level into converter output power; and
provide, in the second mode of operation, the converter output power to the controller via the second output to power the controller,
wherein the second output is disconnected from the first output such that the second output does not provide power to the first switch.

10. The non-transitory computer readable medium according to claim 9, wherein the sequences of instructions include instructions that cause the at least one processor to operate the power circuit to:
receive at least one control signal from the controller indicating whether the load is being powered by the LPS output power.

11. The non-transitory computer readable medium according to claim 10, wherein the sequences of instructions include instructions that cause the at least one processor to operate the power circuit to:
provide the LPS output power to the first output to power processing equipment coupled to the first output, the processing equipment being configured to operate in at least an active state and a sleep state.

12. The non-transitory computer readable medium according to claim 11, wherein the controller is coupled to the processing equipment and configured to provide the at least one control signal such that the power circuit is operated in the first mode of operation while the processing equipment is operating in the active state and in the second mode of operation while the processing equipment is operating in the sleep state.

13. The non-transitory computer readable medium according to claim 12, wherein the second voltage level is a predetermined level selected to optimize efficiency of the power circuit while powering the controller during the second mode of operation.

14. A method of operating a power circuit comprising a Logic Power Supply (LPS) coupled to an input, the method comprising:
receiving input power from an input source at the input;
operating the LPS to convert the input power into output power;
operating the LPS to provide, in a first mode of operation, the output power with a first voltage level to a first output via a first switch in response to receiving an indication that a load coupled to the output is being powered by the output power;
operating the LPS to provide, in a second mode of operation, the output power with a second voltage level to the first switch in response to receiving an indication that the load is not being powered by the output power, the second voltage level being generated by the LPS based on a level sufficient to power a controller coupled to the power circuit;
coupling, with the first switch, the LPS to the output in the first mode of operation;
decoupling, with the first switch, the LPS from the output in the second mode of operation;
converting, in the second mode of operation with a converter coupled to the LPS and a second output, the output power with the second voltage level into converter output power; and
providing, in the second mode of operation, the converter output power to the controller via the second output to power the controller,
wherein the second output is disconnected from the first output such that the second output does not provide power to the first switch.

15. The power circuit of claim 2, wherein the controller is further configured to control the first switch with the at least one control signal indicating whether the load is being powered by the LPS output power.

16. The non-transitory computer readable medium according to claim 10, wherein the sequences of instructions include instructions that cause the at least one processor to operate the power circuit to:
   operate the first switch based on the at least one control signal received from the controller indicating whether the load is being powered by the LPS output power.

17. The method of claim 14, further comprising the controller which is configured to control the first switch based on a determination whether the load is being powered by the output power.

* * * * *